US006191052B1

United States Patent
Wang

(10) Patent No.: US 6,191,052 B1
(45) Date of Patent: Feb. 20, 2001

(54) METHOD FOR FABRICATING AN ULTRA-SHALLOW JUNCTION WITH LOW RESISTANCE USING A SCREEN OXIDE FORMED BY POLY RE-OXIDATION IN A NITROGEN CONTAINING ATMOSPHERE

(75) Inventor: Jyh-Haur Wang, Hsin-chu (TW)

(73) Assignee: Taiwan Semiconductor Manufacturing Company, Hsin-Chu (TW)

(*) Notice: Under 35 U.S.C. 154(b), the term of this patent shall be extended for 0 days.

(21) Appl. No.: 09/236,512

(22) Filed: Jan. 25, 1999

(51) Int. Cl.[7] .......................... H01L 21/31; H01L 21/469
(52) U.S. Cl. ......................... 438/775; 438/301; 438/364
(58) Field of Search ................................ 438/592, 791, 438/301, 764, 775

(56) References Cited

U.S. PATENT DOCUMENTS

| | | | |
|---|---|---|---|
| 4,386,968 | 6/1983 | Hinkel et al. | 148/1.5 |
| 5,296,411 | 3/1994 | Gardner et al. | 437/238 |
| 5,525,529 | 6/1996 | Guldi | 437/28 |
| 5,607,884 | 3/1997 | Byun | 437/41 |
| 5,668,024 | 9/1997 | Tsai et al. | 438/199 |

OTHER PUBLICATIONS

Shishiguchi et al., "33nm Ultra–Shallow Junction Technology by Oxygen–Free and Point–Defect Reduction Process" 0–7803–4700–Jun. 1998.

1998 IEEE pp. 134–135., Symposium on VLSI Technology Digest.

Stinson et al., "Effects of Ion Implantation on Deep–Submicrometer, Drain–Engineered MOSFET Technologies", IEEE Transactions on Electron Devices, vol. 38, No. 3, Mar. 1991.

*Primary Examiner*—Richard Elms
*Assistant Examiner*—Brad Smith
(74) *Attorney, Agent, or Firm*—George O. Saile; Stephen B. Ackerman

(57) ABSTRACT

The invention provides a method for fabricating ultra-shallow, low resistance junctions. In the preferred embodiment, a nitrogen containing screen oxide layer is formed on an undoped area of a substrate by poly re-oxidation using rapid thermal processing in a nitrogen containing atmosphere. Impurity ions are implanted into the substrate, in the undoped area, through the nitrogen containing screen oxide layer to form lightly doped source and drain regions. A post-implant anneal is performed on the lightly doped source and drain regions using a rapid thermal anneal in a nitrogen containing atmosphere. The nitrogen containing screen oxide layer: prevents surface dopant loss during post implant anneal; prevents gate oxide degradation during ion implantation and screen oxide stripping; and acts as a diffusion barrier, reducing oxygen enhanced diffusion. Alternatively, the poly re-oxidation can be performed in an $O_2$ atmosphere followed by a rapid thermal anneal in a nitrogen containing atmosphere.

14 Claims, 2 Drawing Sheets

METHOD FOR FABRICATING AN ULTRA-SHALLOW JUNCTION WITH LOW RESISTANCE USING A SCREEN OXIDE FORMED BY POLY RE-OXIDATION IN A NITROGEN CONTAINING ATMOSPHERE

BACKGROUND OF INVENTION

1) Field of the Invention

This invention relates generally to fabrication of semiconductor devices and more particularly to the fabrication of ultra-shallow, low resistance junctions.

2) Description of the Prior Art

As microelectronic device dimensions decrease, the need to produce ultra-shallow (<60 nm) junctions with low resistance becomes essential. However, conventional ion implantation and annealing processes present several obstacles to formation of ultra-shallow lightly doped source and drain regions necessary for acheiving ultra-shallow junctions with low resistance.

One method of forming ultra-shallow lightly doped source and drain regions is to form a screen oxide layer, implant impurity ions through the screen oxide layer, then perform an anneal to drive in the impurity ions. The disadvantage of this process is that it is susceptible to oxygen enhanced diffusion (OED). OED causes "B" ions to diffuse deeper into the silicon substrate when a screen oxide is used even though the implant depth is shallower than without a screen oxide.

Another process used to form lightly doped source and drain regions is to perform an ion implant and pure $N_2$ drive in without using a screen oxide. This process does not suffer from OED. However, surface dopant loss occurs during the post implant anneal to drive in the impurity ions. Also, due to reduced gate oxide thicknesses associated with reduced scale devices, the lack of a screen oxide can cause gate oxide integrity degradation due to implantation damage.

An alternate approach is to form a screen oxide, perform impurity ion implantation, strip the screen oxide, then anneal to drive in the impurity ions. Since the screen oxide is removed prior to anneal, this process also suffers from surface dopant loss. Although the screen oxide prevents gate oxide degradation due to implantation damage, oxide stripping can also degrade the gate oxide integrity.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,525,529 (Guldi) discloses a screen oxide or screen oxynitride blocking layer and an $NH_3$ anneal after ion implantation.

U.S. Pat. No. 5,607,884 (Byun) discloses a $NH_3$ silicide anneal.

U.S. Pat. No. 5,668,024 (Tsai et al.) discloses a conventional S/D anneal.

U.S. Pat. No. 4,386,968 (Hinkel et al.) shows an ion implantation in $O_2$.

U.S. Pat. No. 5,296,411 (Gardner et al.) shows a nitridation process to produce reliable oxides.

The following technical literature also provide information on relevant technical developments.

Shishiguchi et al., 33 nm Ultra-Shallow Junction Technology by Oxygen-Free and Point Defect Reduction Process, 1998 Symposium on VLSI Technology Digest of Technology, pp. 134–135 teaches fabrication of ultra-shallow junctions using low-energy ion implantation without a cover-oxide.

Stinson et al., Effects of I/I on Deep Submicron Drain Engineered MOSFET Technologies, IEEE Transactions on Electronic Devices, Vol. 38, No. 3, March 1991, pp. 487–497 examines the effects of ion implantation on gate oxide integrity. While gate oxide degradation is considered insignificant for oxide thicknesses of 7 nm and LDD doses (10E14 $cm^2$ and lower), the article predicts that gate oxide degradation will increase as scaling down occurs.

SUMMARY OF THE INVENTION

It is an object of the present invention to provide a method for fabricating ultra-shallow lightly doped source and drain regions having low resistance.

It is another object of the present invention to provide a method for fabricating ultra-shallow lightly doped source and drain regions which reduces oxygen enhanced diffusion (OED).

It is another object of the present invention to provide a method for fabricating ultra-shallow lightly doped source and drain regions which prevents surface dopant loss.

It is yet another object of the present invention to provide a method for fabricating ultra-shallow lightly doped source and drain regions which prevents gate oxide integrity degradation.

To accomplish the above objectives, the present invention provides a method for fabricating ultra-shallow lightly doped source and drain regions. The process begins by providing a substrate having an exposed undoped area. A screen oxide layer is formed on the undoped area. Impurity ions are implanted into the substrate, in the undoped area, through the screen oxide layer to form lightly doped source and drain regions. A post-implant anneal is performed on the lightly doped source and drain regions using a rapid thermal anneal in a nitrogen containing atmosphere to drive in the impurity ions.

The present invention provides considerable improvement over the prior art. The ultra-shallow lightly doped source and drain fabrication method of the present invention can simultaneously reduce oxygen enhanced diffusion (OED) and eliminate surface dopant loss. As a result lower resistance, ultra-shallow lightly doped source and drain regions are produced. The nitrogen at the interface between the nitrogen containing screen oxide and the silicon acts as a diffusion barrier reducing OED. Because the nitrogen containing screen oxide layer does not have to be removed to reduce OED, it prevents surface dopant loss during post-implant annealing.

Another advantage of the present invention is that the nitrogen containing screen oxide layer prevents gate oxide degradation which can be caused by ion implant damage when no screen oxide layer is used.

The present invention achieves these benefits in the context of known process technology. However, a further understanding of the nature and advantages of the present invention may be realized by reference to the latter portions of the specification and attached drawings. Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for fabricating ultra-shallow lightly doped source and drain regions.

Figure 1:
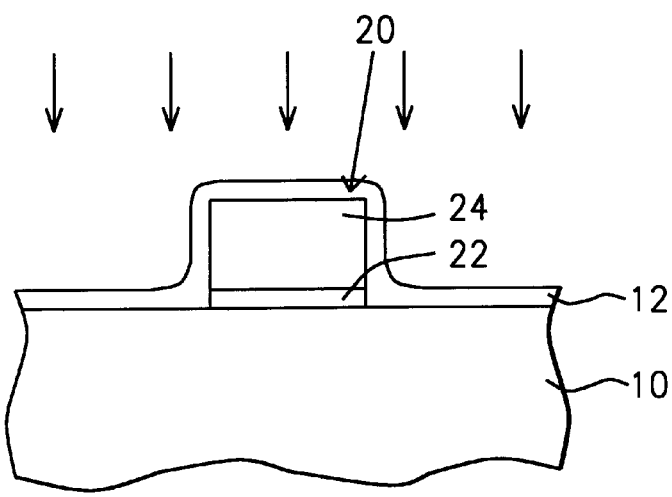
FIGS. 1 and 2 illustrate sequential sectional views of a process for fabricating ultra-shallow lightly doped source and drain regions according to the invention.

Referring to FIG. 1, the process begins by providing a substrate (10) having a gate structure (20) thereon. The gate structure includes a gate oxide layer (22) and a gate electrode (24). The substrate (10), also has an exposed undoped area where the ultra-shallow lightly doped source and drain regions adjacent to the gate structure.

A nitrogen containing screen oxide layer (12) is formed on the undoped area. In the first embodiment, the nitrogen containing screen oxide layer (12) is formed by poly re-oxidation using a rapid thermal process in a nitrogen containing atmosphere. The nitrogen containing screen oxide layer (12) preferably has a thickness of between 20 Å and 70 Å comprising nitrogen at a concentration of between about 2 atomic percent (at. %) and 7 atomic percent at the oxide/silicon interface (12/10). The actual nitrogen concentration is determined primarily by process temperature, a higher temperature yielding a higher concentration of nitrogen.

Figure 3:
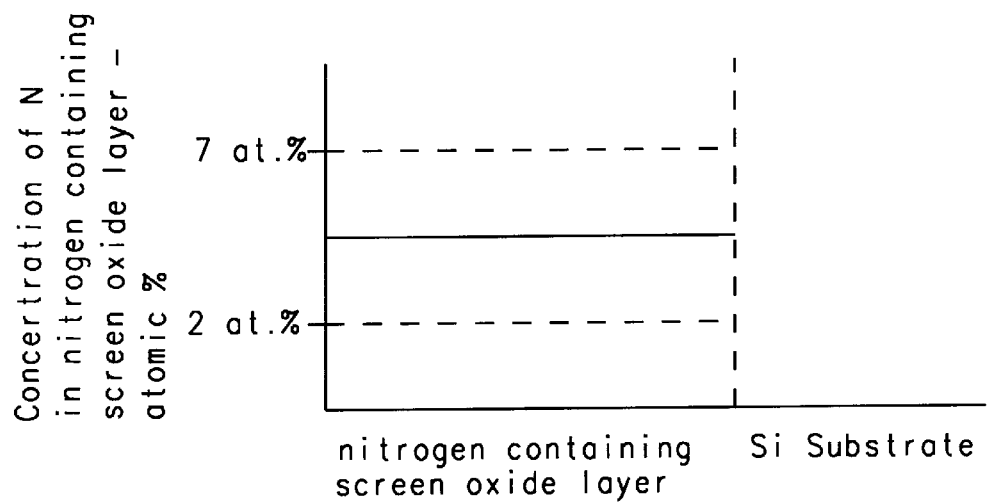
FIGS. 3 and 4 are graphical depictions of nitrogen concentration in a screen oxide layer of the invention in which the nitrogen atmosphere is NO and $N_2O$ respectively.
Figure 4:
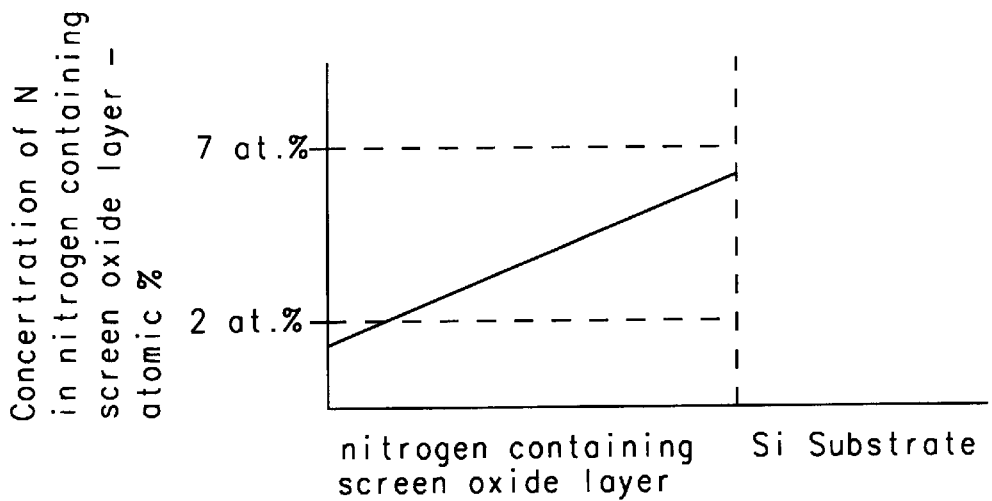

A key point of the invention is that the nitrogen concentration in the nitrogen containing screen oxide layer (12) must be high enough at the interface with the silicon substrate (10) to act as a diffusion barrier. The inventors have determined that this concentration is between about 2 at. % and 7 at. %. The concentration can be uniform throughout the nitrogen containing screen oxide layer (12) as shown in FIG. 3 when, for example, the nitrogen containing screen oxide layer (12) is grown in an NO atmosphere. Alternatively, the nitrogen can pile up at the oxide/silicon interface (nitrogen containing screen oxide layer (12)/silicon substrate (10)) decreasing in concentration with increasing distance from the interface as shown in FIG. 4 when, for example, the nitrogen containing screen oxide layer (12) is grown in an $N_2O$ atmosphere. The poly re-oxidation rapid thermal process is preferably performed at a temperature of between about 900° C. and 1150° C. for a time of between 5 seconds and 300 seconds. The nitrogen containing atmosphere can be NO, $N_2O$, or $NH_3$.

Figure 2:
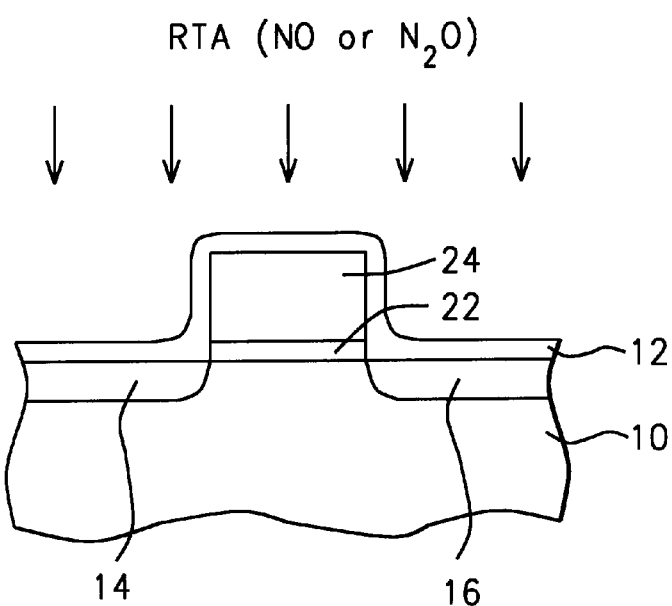

Referring to FIG. 2, impurity ions are implanted into the substrate (10), in the undoped area, through the nitrogen containing screen oxide layer (12) to form lightly doped source and drain regions (14, 16). The impurity ions are preferably "$BF_2$" ions. The "$BF_2$" impurity ions are preferably implanted at an energy of between about 3 KeV and 15 KeV and at a dose of between $10^{13}$ atm/cm$^2$ and $10^5$ atm/cm$^2$. Alternatively, the impurity ions can be "B" ions, implanted at an energy of between about 0.5 KeV and 3 KeV and at a dose of between $10^{13}$ atm/cm$^2$ and $10^{15}$ atm/cm$^2$.

An advantage of the present invention is that the nitrogen containing screen oxide layer prevents gate oxide degradation which can be caused by ion implant damage when no screen oxide layer is used.

Following ion implantation, a post-implant anneal is performed on the lightly doped source and drain regions (14, 16) to drive in the impurity ions. The post-implant anneal uses a rapid thermal anneal at a temperature of between 900° C. and 1050° C. for a time of between about 1 second and 30 seconds in a nitrogen containing atmosphere. The nitrogen containing atmosphere can be $NH_3$ or most preferably pure $N_2$.

The key advantage of the present invention is that it can simultaneously reduce oxygen enhanced diffusion (OED) and eliminate surface dopant loss, enabling lower resistance, ultra-shallow lightly doped source and drain regions. The nitrogen at the interface between the nitrogen containing screen oxide and the silicon acts as a diffusion barrier reducing OED. OED is detrimental to device performance because it increases resistance in the lightly doped source and drain regions. Because the nitrogen containing screen oxide layer does not have to be removed to reduce OED, it prevents surface dopant loss during post-implant annealing. Surface dopant loss also increases resistance in lightly doped source and drain regions.

An alternative to the first embodiment is possible where the nitrogen containing screen oxide layer is formed by poly re-oxidation in an $O_2$ atmosphere, followed by a rapid thermal anneal in a NO, $N_2O$ or $NH_3$ atmosphere. The poly re-oxidation is performed at a temperature of between about 900° C. and 1000° C. for a time of between about 20 seconds and 100 seconds. Following poly re-oxidation, rapid thermal annealing is performed at a temperature of between 900° C. and 1150° C. for a time of between about 5 seconds and 300 seconds in an NO or $N_2O$ atmosphere.

This process enables the screen oxide layer to be grown faster than it would be in a nitrogen containing atmosphere. As with the first embodiment, the nitrogen concentration in the nitrogen containing screen oxide layer (12) can vary, but it must be between about 2 at. % and 7 at. % at the interface with the silicon substrate (10).

While the invention has been particularly shown and described with reference to the preferred embodiments thereof, it will be understood by those skilled in the art that various changes in form and details may be made without departing from the spirit and scope of the invention. For example, while an N-type device is illustrated, it will be understood by those skilled in the art that a P-type device can be made by using a different implant species.

What is claimed is:

1. A method for fabricating ultra-shallow, low resistance junctions, comprising of the steps of:
   a. providing a substrate having an exposed undoped area;
   b. forming a nitrogen containing screen oxide layer on said undoped area of said substrate; wherein said nitrogen containing screen oxide layer has a thickness of between about 20 Å and 70 Å and said screen oxide layer comprises between about 2 at. % and 7 at. % nitrogen at the interface with said substrate;
   c. implanting impurity ions into said substrate, in said undoped area, through said nitrogen containing screen oxide layer to form lightly doped source and drain regions; and d. performing a post-implant anneal on said lightly doped source and drain regions using a rapid thermal anneal in a nitrogen containing atmosphere.

2. The method of claim 1 wherein said impurity ions are "BF" ions implanted at an energy of between about 3 KeV and 15 KeV and at a dose of between $10^{13}$ atm/cm$^2$ and $10^{15}$ atm/cm$^2$.

3. The method of claim 1 wherein said nitrogen containing screen oxide layer is formed by poly re-oxidation in a NO or N$_2$O atmosphere.

4. The method of claim 1 wherein said nitrogen containing screen oxide layer is formed by poly re-oxidation in an O$_2$ atmosphere followed by a rapid thermal anneal in a NO or N$_2$O atmosphere.

5. The method of claim 1 wherein said post-implant anneal is performed in an atmosphere comprising pure N$_2$, at a temperature of between about 900° C. and 1050° C., for a time of between about 1 second and 30 seconds.

6. A method for fabricating ultra-shallow, low resistance junctions, comprising of the steps of:

a. providing a substrate having a gate structure thereon; said substrate having an exposed undoped area adjacent to said gate structure;

b. forming a nitrogen containing screen oxide layer on said undoped area of said substrate; said nitrogen containing screen oxide layer being formed by poly re-oxidation in an oxygen atmosphere followed by a post re-oxidation rapid thermal anneal in a nitrogen containing atmosphere; wherein said nitrogen containing screen oxide layer has a thickness of between about 20 Å and 70 Å and said screen oxide layer comprises between about 2 at. % and 7 at. % nitrogen at the interface with said substrate;

c. implanting impurity ions into said substrate, in said undoped area, through said nitrogen containing screen oxide layer to form lightly doped source and drain regions; whereby said nitrogen containing screen oxide layer prevents gate oxide degradation; and d. performing a post-implant anneal on said lightly doped source and drain regions using a rapid thermal anneal in a nitrogen containing atmosphere; whereby said nitrogen containing screen oxide layer prevents surface dopant loss, and said nitrogen in said nitrogen containing screen oxide layer acts as a diffusion barrier at the oxide/silicon interface reducing oxygen enhanced diffusion.

7. The method of claim 6 wherein said impurity ions are "BF" ions implanted at an energy of between about 3 KeV and 15 KeV and at a dose of between $10^{13}$ atm/cm$^2$ and $10^{15}$ atm/cm$^2$.

8. The method of claim 6 wherein said post re-oxidation rapid thermal anneal is performed in an NO atmosphere at a temperature of between about 900° C. and 1150° C. for a time of between about 5 seconds and 300 seconds.

9. The method of claim 6 wherein said post re-oxidation rapid thermal anneal is performed in an N$_2$O atmosphere at a temperature of between about 900° C. and 1150° C. for a time of between about 5 seconds and 300 seconds.

10. The method of claim 6 wherein said post-implant anneal is performed in an atmosphere comprising pure N$_2$, at a temperature of between about 900° C. and 1050° C., for a time of between about 1 second and 30 seconds.

11. A method for fabricating ultra-shallow, low resistance junctions, comprising of the steps of:

a. providing a substrate having a gate structure thereon; said substrate having an exposed undoped area adjacent to said gate structure;

b. forming a nitrogen containing screen oxide layer on said undoped area of said substrate; said nitrogen containing screen oxide layer being formed by poly re-oxidation using a rapid thermal process in a nitrogen containing atmosphere; wherein said nitrogen containing screen oxide layer has a thickness of between about 20 Å and 70 Å and said screen oxide layer comprises between about 2 at. % and 7 at. % nitrogen at the interface with said substrate;

c. implanting impurity ions into said substrate, in said undoped area, through said nitrogen containing screen oxide layer to form lightly doped source and drain regions; whereby said nitrogen containing screen oxide layer prevents gate oxide degradation; and d. performing a post-implant anneal on said lightly doped source and drain regions using a rapid thermal anneal in a nitrogen containing atmosphere; whereby said nitrogen containing screen oxide layer prevents surface dopant loss and said nitrogen in said nitrogen containing screen oxide layer acts as a diffusion barrier at the oxide/silicon interface reducing oxygen enhanced diffusion.

12. The method of claim 11 wherein said impurity ions are "BF" ions implanted at an energy of between about 3 KeV and 15 KeV and at a dose of between $10^{13}$ atm/cm$^2$ and $10^{15}$ atm/cm$^2$.

13. The method of claim 11 wherein said poly re-oxidation is performed in an NO atmosphere at a temperature of between about 900° C. and 1150° C. for a time of between about 5 seconds and 300 seconds.

14. The method of claim 11 wherein said poly re-oxidation is performed in an N$_2$O atmosphere at a temperature of between about 900° C. and 1150° C. for a time of between about 5 seconds and 300 seconds.

* * * * *